(12) United States Patent
Wang et al.

(10) Patent No.: US 10,656,531 B2
(45) Date of Patent: May 19, 2020

(54) APPARATUS AND METHOD FOR PROCESS-WINDOW CHARACTERIZATION

(71) Applicant: ASML NETHERLANDS B.V., Veldhoven (NL)

(72) Inventors: Te-Sheng Wang, San Jose, CA (US); Xiang Wan, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/061,501

(22) PCT Filed: Dec. 8, 2016

(86) PCT No.: PCT/EP2016/080266
§ 371 (c)(1),
(2) Date: Jun. 12, 2018

(87) PCT Pub. No.: WO2017/108432
PCT Pub. Date: Jun. 29, 2017

(65) Prior Publication Data
US 2019/0258169 A1    Aug. 22, 2019

Related U.S. Application Data

(60) Provisional application No. 62/270,953, filed on Dec. 22, 2015.

(51) Int. Cl.
*G03F 7/20* (2006.01)

(52) U.S. Cl.
CPC .......... *G03F 7/705* (2013.01); *G03F 7/70558* (2013.01); *G03F 7/70616* (2013.01); *G03F 7/70625* (2013.01); *G03F 7/70641* (2013.01)

(58) Field of Classification Search
CPC ....... G06K 9/6202; G06K 2009/00738; G06K 9/00228; G06K 9/00677; G06T 7/0002;
(Continued)

(56) References Cited

U.S. PATENT DOCUMENTS 5,229,872 A    7/1993   Mumola
5,296,891 A    3/1994   Vogt et al.
(Continued)

FOREIGN PATENT DOCUMENTS

WO    2007120279 A2    10/2007

OTHER PUBLICATIONS

International Search Report issued in corresponding International Application No. PCT/EP2016/080266 dated Feb. 27, 2017.
(Continued)

*Primary Examiner* — Mesfin T Asfaw
(74) *Attorney, Agent, or Firm* — Pillsbury Winthrop Shaw Pittman LLP

(57) ABSTRACT

A process of characterizing a process window of a patterning process, the process including: obtaining a set of inspection locations for a pattern, the pattern defining features to be applied to a substrate with a patterning process, the set of inspection locations corresponding to a set of the features, the set of features being selected from among the features according to sensitivity of the respective features to variation in one or more process characteristics of the patterning process; patterning one or more substrates under varying process characteristics of the patterning process; and determining, for each of the variations in the process characteristics, whether at least some of the set of features yield unacceptable patterned structures on the one or more substrates at corresponding inspection locations.

21 Claims, 9 Drawing Sheets

US 10,656,531 B2
Page 2

(58) Field of Classification Search
CPC .. G06T 7/55; G06T 7/74; G06T 7/001; G06T 7/13; G06T 7/248; G06T 19/00; G06T 7/0004; G06T 7/136; G06T 7/174; G06T 7/50; G06T 7/571; G06T 7/75; G06T 7/80; H04N 5/23229; H04N 5/23238; H04N 21/23418; H04N 21/442
See application file for complete search history.

(56) References Cited

U.S. PATENT DOCUMENTS

| | | |
|---|---|---|
| 5,523,193 A | 6/1996 | Nelson |
| 5,965,306 A | 10/1999 | Mansfield et al. |
| 6,046,792 A | 4/2000 | Van Der Werf et al. |
| 7,587,704 B2 | 9/2009 | Ye et al. |
| 7,932,004 B1 | 4/2011 | Xiong et al. |
| 2007/0031745 A1* | 2/2007 | Ye .................. G03F 7/705 430/30 |
| 2008/0167829 A1 | 7/2008 | Park et al. |
| 2009/0157360 A1 | 6/2009 | Ye et al. |
| 2011/0276935 A1 | 11/2011 | Fouquet et al. |
| 2011/0286656 A1 | 11/2011 | Kulkarni et al. |
| 2012/0216169 A1 | 8/2012 | Park et al. |
| 2013/0179847 A1 | 7/2013 | Hansen |
| 2014/0153814 A1 | 6/2014 | Lin et al. |
| 2014/0208276 A1 | 7/2014 | Cao et al. |
| 2015/0005917 A1 | 1/2015 | Yiin et al. |
| 2015/0045935 A1 | 2/2015 | Cao et al. |
| 2015/0069232 A1 | 3/2015 | Lin et al. |
| 2015/0227654 A1 | 8/2015 | Hunsche et al. |
| 2015/0356233 A1 | 12/2015 | Fouquet et al. |
| 2016/0116420 A1 | 4/2016 | Duffy et al. |
| 2016/0217240 A1 | 7/2016 | Lin et al. |
| 2016/0274036 A1 | 9/2016 | Plihal |

OTHER PUBLICATIONS

Office Action dated Nov. 20, 2019 Issued in corresponding Chinese Patent Application No. 201680082380.5 with English transiation.

* cited by examiner

APPARATUS AND METHOD FOR PROCESS-WINDOW CHARACTERIZATION

CROSS-REFERENCE TO RELATED APPLICATIONS

This application claims priority of U.S. application 62/270,953 which was filed on Dec. 22, 2015 and which is incorporated herein in its entirety by reference.

BACKGROUND

Field

The present invention relates generally to patterning processes and, more specifically, to process-window characterization of patterning processes.

Description of the Related Art

Patterning processes take many forms. Examples include photolithography, electron-beam lithography, imprint lithography, inkjet printing, directed self assembly, and the like. Often these processes are used to manufacture relatively small, highly-detailed components, such as electrical components (like integrated circuits or photovoltaic cells), optical components (like digital mirror devices or waveguides), and mechanical components (like accelerometers or microfluidic devices).

Patterning processes are often characterized to improve quality or raise yields. Often, defects from a patterning process can be relatively expensive, as the defects tend to be repeated, or occur relatively frequently, across production runs of patterned components. To mitigate such defects, when introducing new (or new variations of) a patterning process, such as a new reticle, patterning tool (or recently serviced tool), processes recipe, consumable, or product, manufacturers often empirically characterize a process window of the new processes. The process window generally indicates, for one or more characteristics of the patterning process, how much the characteristics can vary without introducing unacceptable amounts of defects, e.g., ranges of acceptable focus and exposure for a photolithographic process that yield patterned structures within tolerances for spatial, electrical, optical, or other dimensions.

SUMMARY

The following is a non-exhaustive listing of some aspects of the present techniques. These and other aspects are described in the following disclosure.

Some aspects include a process of characterizing a process window of a patterning process, the process including: obtaining a set of inspection locations for a pattern, the pattern defining features to be applied to a substrate with a patterning process, the set of inspection locations corresponding to a subset of the features, the subset of features being selected from among the features according to sensitivity of the respective features to variation in one or more process characteristics of the patterning process; patterning one or more substrates under varying process characteristics; and determining, for each of the variations in the process characteristics, whether at least some of the subset of features yielded unacceptable patterned structures on the one or more substrates at corresponding inspection locations.

Some aspects include a process of obtaining inspections locations to qualify a patterning process, the method comprising: simulating, with one or more computers, a patterning process with a plurality of different simulations, each under different process characteristics, and each with at least some of the same features in a pattern; for each of the different simulations, detecting features that the respective simulation indicates are unacceptable in a respective simulation result; and selecting a subset of the features based on the detected features.

Some aspects include a tangible, non-transitory, machine-readable medium storing instructions that when executed by a data processing apparatus cause the data processing apparatus to perform operations including the above-mentioned process.

Some aspects include a system, including: one or more processors; and memory storing instructions that when executed by the processors cause the processors to effectuate operations of the above-mentioned process.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
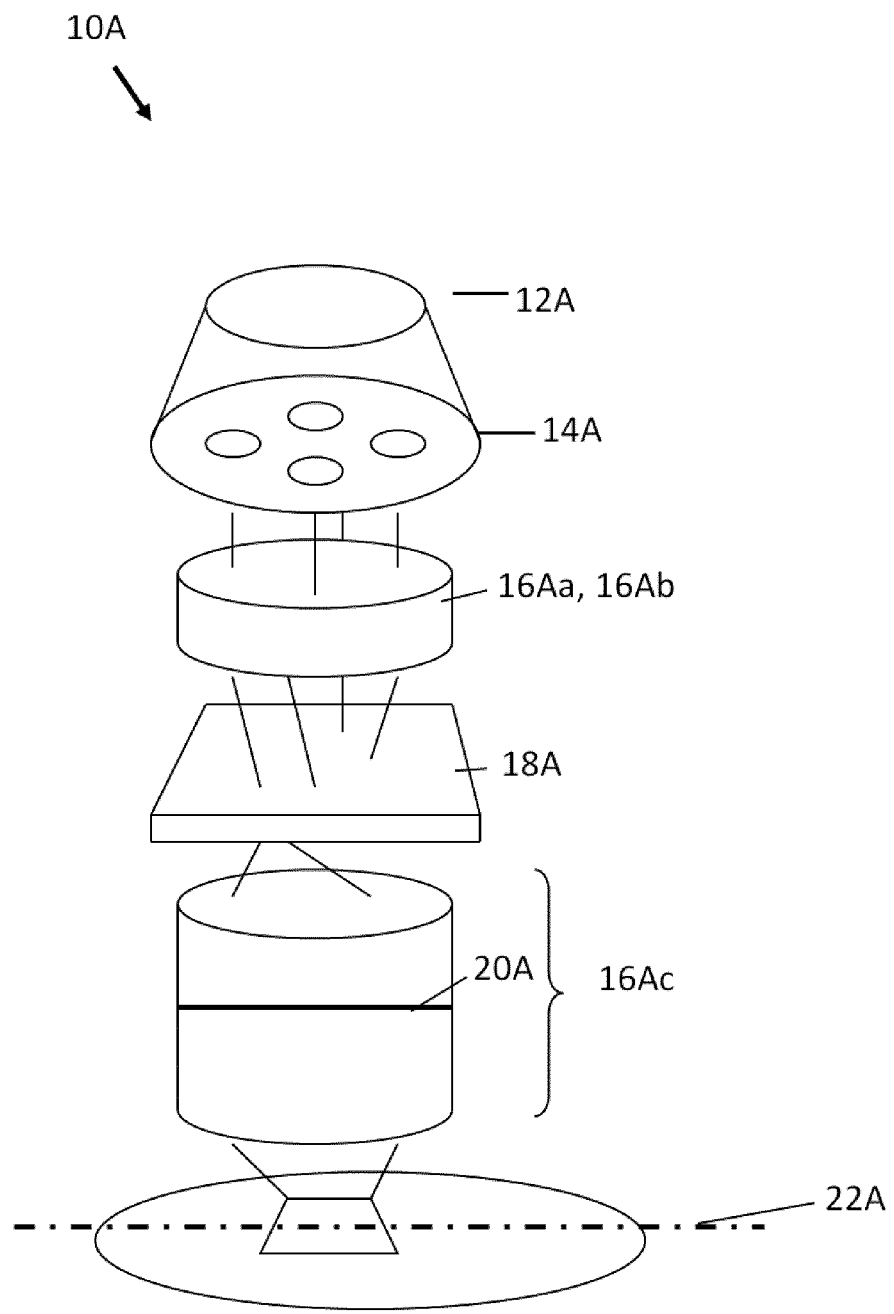
FIG. 1 is a block diagram of a lithography system.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field. Indeed, the inventors wish to emphasize the difficulty of recognizing those problems that are nascent and will become much more apparent in the future should trends in the lithography industry, and industries using similar processing techniques, continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

Many process-window characterization techniques are too slow due, in part, to the way in which defects are detected. Often defects are detected by comparing a reference example of a pattern to patterns formed under intentionally varied process characteristics. In one example a wafer may be patterned according to a focus-exposure matrix along-side reference patterns formed with un-perturbed patterning process characteristics. Then, defects may be detected by bright-field inspection techniques in which a reference pattern (e.g., a die or exposure field), expected to be relatively free of defects, is compared to the same pattern formed under varied process conditions. Differences between the two patterns may then be detected and identified as defects, a process which often makes relatively difficult to find, relatively small defects in highly detailed patterns easier to identify. Obtaining these reference patterns tends to slow the process-window characterization process.

Often, to obtain the reference pattern, the process characteristics that produce the reference structure are first determined empirically, with relatively slow trial-and-error repetitions in which the process is centered before measuring the process window. For instance, focus and exposure of a photolithographic process may be centered (e.g., optimized) with a focus-exposure matrix (often iteratively) before exposing another focus-exposure matrix along-side centered patterns to characterize the process window. This pre-centering technique can add 12 hours, or substantially more depending on the number of iterations taken, to center the process before a process window is characterized. The extra time is expensive. Equipment used in patterning processes is often relatively expensive, so time taken to characterize process windows can impose substantial costs on those operating such processes.

In some embodiments, particularly sensitive portions of a pattern may be identified through computer simulations, so likely locations of defects can be identified without comparison to a reference pattern produced with a pre-centered process. As a result, in some embodiments, the separate process pre-centering step is potentially avoided (or consolidated with process window characterization), or at least expedited. This is expected to reduce manufacturing costs, as patterning equipment produce higher throughput due to reduced downtime. That said, some embodiments may also use a pre-centering step, as the present techniques are useful for a variety of other reasons. For instance, some embodiments may improve the reliability of the above-described bright-field inspection techniques, e.g., by lowering the threshold to detect a defect in locations that simulations indicate are likely to yield defects when comparing reference images to test images. These techniques are best understood in view of an example of a type of patterning process.

A lithographic projection apparatus can be used, for example, in the manufacture of integrated circuits (ICs). In such a case, a patterning device (e.g., a mask) may specify a pattern corresponding to a layer of the IC ("design layout"), such as a via layer, an interconnect layer, or gate layer, or the like. This pattern, often forming part of a circuit, may be transferred onto a target portion (e.g. one or more dies in an exposure field) on a substrate (e.g., a silicon wafer) that has been coated with a layer of radiation-sensitive material (e.g., "resist"). Transfer techniques include irradiating the target portion through the circuit pattern on the patterning device. Often, a single substrate contains a plurality of adjacent target portions to which the circuit pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device may be transferred to one target portion progressively. Often, the lithographic projection apparatus will have a magnification factor M (generally <1), so the speed F at which the substrate is moved will be a factor M times that at which the projection beam scans the patterning device. More information about examples of some lithographic devices are described, for example, by U.S. Pat. No. 6,046,792, incorporated herein by reference.

A variety of processes may occur before and after exposure. Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation or diffusion (doping), metallization, oxidation, chemical-mechanical polishing, etc., to form a layer of the device. If several layers are required in the device, then variations on this procedure may be repeated for each layer, often with a different pattern specified by a different patterning device at each layer. Eventually, a device may be formed in each target portion on the substrate. These devices may then be separated from one another by a technique such as dicing or sawing, whence the individual devices can be mounted on a carrier, connected to pins, ball-grid arrays, etc. Or some embodiments may encapsulate devices before simulation.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law." Often, layers of devices are manufactured using lithographic projection apparatuses that project a design layout onto a substrate using illumination from a deep-ultraviolet illumination source, creating individual functional elements having dimensions well below 100 nm, i.e., less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD = k_1 \times \lambda / NA$, where $\lambda$ is the wavelength of radiation employed (often 248 nm or 193 nm for photolithography), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a circuit designer in order to achieve particular electrical functionality and performance.

To overcome these difficulties, fine-tuning steps are often applied to the lithographic projection apparatus or design layout. These include, for example, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. Examples of "projection optics" include components operating according to any of these design types for directing, shaping or controlling the projection beam of radiation, collectively or singularly. Examples of "projection optics" include optical components in a lithographic projection apparatus, no matter where the optical component is located on an optical path of the lithographic projection apparatus. Projection optics may include optical components for shaping, adjusting or projecting radiation from the source before the radiation passes the patterning device, or optical components for shaping, adjusting or projecting the radiation after the radiation passes the patterning device. The projection optics generally exclude the source and the patterning device.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle," "wafer," or "die" in this text should be considered as interchangeable with the more general terms "mask", "substrate," and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). In some embodiments, examples of "radiation" and "beam" also include electrical radiation, such as electron beams or ion beams, by which patterns are transferred.

The term "optimizing" and "optimization" as used herein refers to or means adjusting a lithographic projection apparatus, a lithographic process, etc. such that results or processes of lithography have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g., a local optimum, in at least one relevant metric, compared to an initial set of one or more values for those one or more parameters. These terms do not require identifying a global optimum and can encompasses improvements short of a global optimum. In an embodiment, optimization steps can be applied iteratively to provide further improvements in one or more metrics. Steps in which an error function or loss function is minimized (e.g., reduced to, or at least closer to, a minimum) in an optimizing process should be read as generic to steps in which signs are reversed and a fitness function is maximized (e.g., increased to, or at least closer to, a maximum), and vice versa.

In some embodiments, the lithographic projection apparatus may be of a type having two or more tables (e.g., two or more substrate table, a substrate table and a measurement table, two or more patterning device tables, etc.). In such "multiple stage" devices a plurality of the multiple tables may be used concurrently, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above may specify some or all of one or more design layouts (e.g., a portion of a design layout for double-patterning, or an entire layout). The design layout can be generated using CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit elements (such as gates, capacitors, etc.), vias, or interconnect lines, so as to reduce the likelihood of the circuit devices or lines interacting with one another in a material, undesirable way. One or more of the design rule limitations may be referred to as "critical dimensions" (CD). A critical dimension of a circuit, in some contexts, refers to the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" refers to a device that can be used to endow an incoming radiation beam with a patterned cross-section (which may unfold over time, e.g., in scanning or electron-beam lithography), corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Non-optical patterning devices include an electron beam modulator coupled to a data source for a design layout and configured to spatially modulate the beam according to the layout. Other examples include a mold for imprint lithography and an inkjet printer, e.g., with electrically conductive or insulative ink.

As a brief introduction, FIG. 1 illustrates an example of a lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin (Θmax), n is the Index of Refraction of the media between the last element of projection optics and the substrate, and Θmax is the largest angle of the beam exiting from the projection optics that can still impinge on the substrate plane 22A. The radiation from the radiation source 12A may not necessarily be at a single wavelength. Instead, the radiation may be at a range of different wavelengths. The range of different wavelengths may be characterized by a quantity called "imaging bandwidth," "source bandwidth" or simply "bandwidth," which are used interchangeably herein. A small bandwidth may reduce the chromatic aberration and associated focus errors of the downstream components, including the optics (e.g., optics 14A, 16Aa and 16Ab) in the source, the patterning device and the projection optics. However, that does not necessarily lead to a rule that the bandwidth should never be enlarged.

In an optimization process of a patterning process using a patterning system, a figure of merit of the system can be represented as a cost function. The optimization process may include finding a set of parameters (e.g., design variables and parameter settings) of the system that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (e.g., worst deviation). "Evaluation points" may include any characteristics of the system, depending on the context. The design variables of the system can be confined to finite ranges and may be interdependent due to practicalities of implementations of the system. In the case of a lithographic projection apparatus, the constraints are often associated with physical properties and characteristics of the hardware such as tunable ranges, or patterning device manufacturability design rules, and the evaluation points can include physical points on a resist image on a substrate, as well as non-physical characteristics such as dose and focus.

In some examples of a lithographic projection apparatus, a source provides illumination (or other types of radiation) to a patterning device and projection optics direct and shape the illumination, via the patterning device, onto a substrate. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related to properties of the resist layer (e.g., only to these properties) (e.g., effects of chemical processes which occur during exposure, PEB and development). Optical properties of the lithographic projection apparatus (e.g., properties of the source, the patterning device and the projection optics) may dictate the aerial image. Since the patterning device used in the lithographic projection apparatus can be changed in some embodiments, it is often desirable to separate the optical properties of the patterning device from the optical properties of the rest of the lithographic projection apparatus including at least the source and the projection optics.

Figure 2:
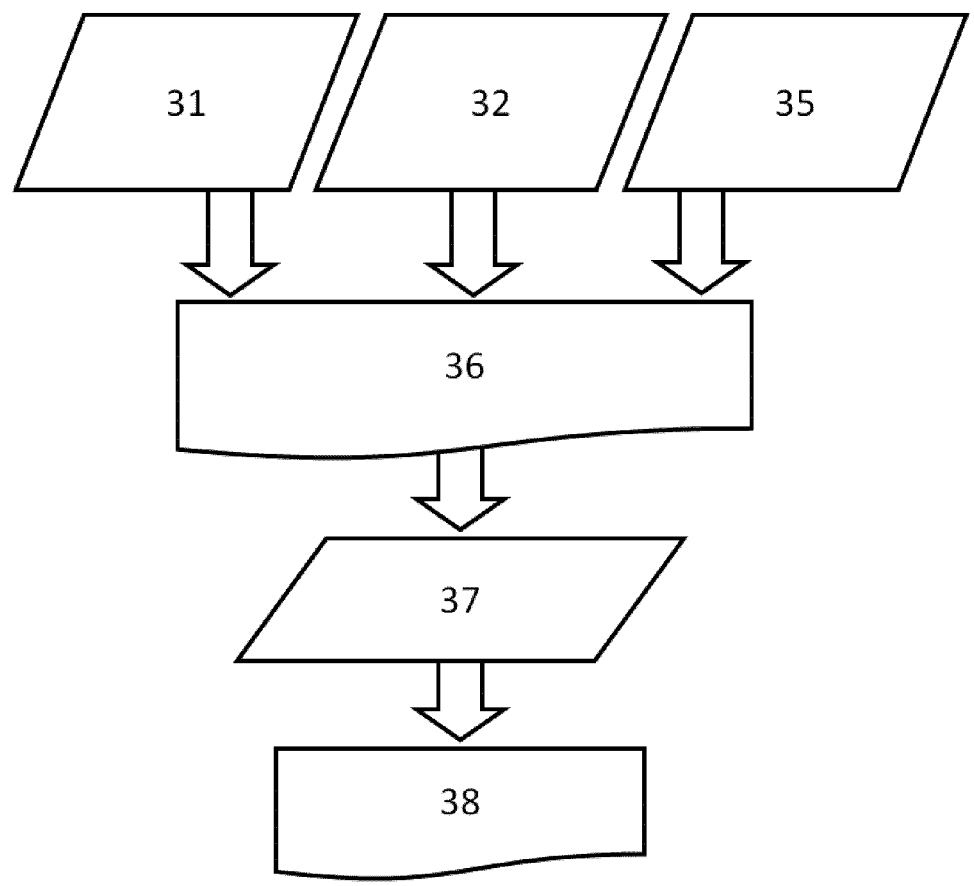
FIG. 2 is a block diagram of simulation models of a patterning process.

An exemplary flow chart for simulating lithography in a lithographic projection apparatus is illustrated in FIG. 2. A source model 31 represents optical characteristics (including radiation intensity distribution, bandwidth and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image. In some embodiments, the simulation may yield spatial dimensions of simulated patterned structures formed on a simulated substrate by a simulated process, such as line-widths, sidewall taper or curvature, via diameters, fillet radii, chamfer radii, surface roughness, internal stress or strain, overlay, etc.

In some embodiments, the source model 31 may represent the optical characteristics of the source that include, for example, NA settings, sigma (σ) settings as well as any particular illumination shape (e.g. off-axis radiation sources such as annular, quadrupole, dipole, etc.). The projection optics model 32 may represent the optical characteristics of the projection optics, including aberration, distortion, one or more refractive indexes, one or more physical sizes, one or more physical dimensions, etc. The design layout model 35 may represent one or more physical properties of a physical patterning device, as described, for example, in U.S. Pat. No. 7,587,704, which is incorporated by reference in its entirety. The objective of the simulation is to predict, for example, edge placement, aerial image intensity slope or CD, which can then be compared against an intended design. The intended design is generally defined as a pre-OPC design layout which can be provided in a standardized digital file format such as GDSII or OASIS or other file format.

Various patterning systems and processes may be characterized with the techniques described below with reference to FIGS. 3 and 4. In some embodiments, characterization may include generating a set of inspection locations on a substrate, the locations corresponding to structures in a pattern that are relatively sensitive to variations in process characteristics of the patterning process, as is described below with reference to FIG. 3. Some embodiments may use sets of inspection locations to determine a process window of a patterning process, as is described below with reference to FIG. 4. In some embodiments, these techniques may facilitate process characterization that is relatively fast and accurate.

Figure 3:
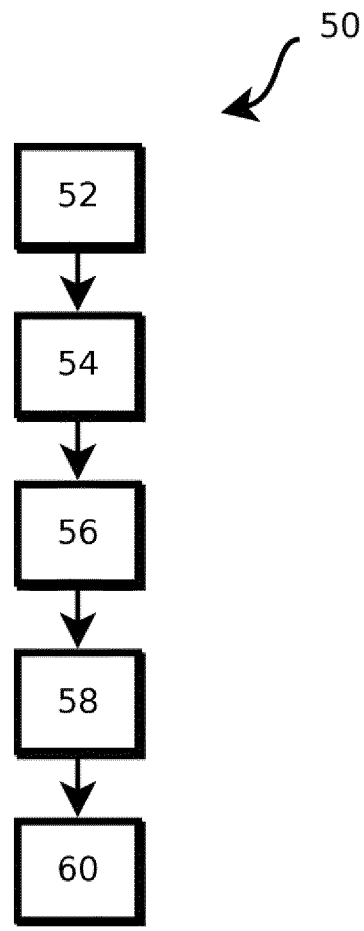
FIG. 3 is a flowchart of a process for identifying inspection locations.

In some embodiments, as shown in FIG. 3, a process 50 may select inspection locations for process characterization. In some implementations, the inspection locations may be the location of structures within a pattern that are relatively sensitive to variations in one or more process characteristics of a patterning process. Examples of such structures include features that are challenging to reproduce with a given patterning process, for instance, features that are positioned relatively close to one another, features that are relatively small and isolated, or features that have relatively intricate shapes, e.g., relative to the wavelength of radiation used in a patterning process. Often a given pattern includes both features that are easier to pattern and a subset of features that are relatively challenging and, thus, sensitive to variations in the patterning process, like drift in focus, exposure, resist chemistry, thermal deformation of optical elements, misalignment, and the like.

Inspection locations may be expressed in a variety of formats. In some embodiments, inspection locations are expressed in an absolute location on a substrate, for instance as X and Y coordinates relative to a notch or alignment mark. In another example, inspection locations are expressed relative to an exposure field on a substrate, for instance, as orthogonal offset distances relative to an alignment mark within a pattern, like an alignment mark in a scribe line. In another example, inspection locations are expressed relative to a die or other repeated pattern within an exposure field. In some embodiments, inspection locations are expressed as a bounding box or other polygon encompassing a pattern structure of interest. In some embodiments, inspection locations are expressed as lines spanning such a structure, e.g., spanning the structure and only the structure.

In some embodiments, inspection locations may be expressed in a format suitable for import to certain metrology tools. For example, in some embodiments, measurement locations may be expressed in a format suitable for import to an automated electron-beam inspection tool. In some embodiments, such a tool may ingest a wafer, align an electron-beam to a reference mark on the substrate (e.g., an instance of such a mark for a particular exposure field), and then iteratively move to each of a set of imported measurement locations and perform a measurement of a structure at the specified locations, for instance, by imaging the structure.

In some embodiments, such images, or other acquired spatially sampled intensity data may be processed with image processing algorithms. For example, an edge detection algorithm, like a Canny-Deriche edge detection routine may be executed on the acquired data to indicate the edges of a feature. In some embodiments, the distance between edges may be measured to indicate the spatial dimensions of pattern structures at the measurement locations, like line width, via diameter, sidewall slope, and corner radius. Examples of such special dimensions include critical dimensions. In some embodiments, each inspection location may be associated with an image processing recipe by which the corresponding structure is characterized with one or more measurements corresponding to that inspection location. In some embodiments, the number of inspection locations may be relatively large, e.g., more than 100 per exposure field, and often more than 1,000, and the inspection process may be automated, e.g., with an HMI e-beam inspection system from Hermes Microvision, Inc. of 7F, No. 18, Puding Road, East Dist., Hsinchu City 300, Taiwan (R.O.C.).

In some embodiments, a set of measurement locations may be expressed in a format suitable for import to other types of metrology tools, including brightfield inspection tools, manual optical microscopes, profilometers, scatterometers, atomic force microscopes, focused ion beam sectioning tools, and the like. In some embodiments, measurement locations may be expressed in terms of performance of electrical test structures, such as a logical address of such a test structure, for purposes of evaluating, e.g., capacitance, resistance, threshold voltage, current leakage, parasitic capacitance, parasitic inductance, and the like.

As discussed above, knowing in advance which structures are more likely to be sensitive to varied process characteristics can expedite process characterization. In some cases, the need for a reference pattern to compare against patterns formed under varying process conditions may be obviated. This may reduce the need for, or time spent, centering a patterning process, or refinement of centering of a patterning process, prior to process-window characterization. Some embodiments may recapture 12 hours or more of uptime for a patterning system. In some embodiments, process-window characterization may be performed concurrently with process centering. Or in some embodiments, traditional process centering techniques may be used, and the measurement locations may be used to evaluate potential defects, for example, by lowering a threshold score at which a defect is detected in response to that potential defect corresponding to a location of a sensitive structure.

In some embodiments, the process 50 includes obtaining a pattern for a patterning process to be characterized, as indicated by block 52. As noted above characterization may take a variety of different forms, including process qualification and process window measurement. In some embodiments, the pattern may be a design layout or the pattern may be an optimized pattern of a mask generated based on the design layout and including, for example, sub resolution assist features, optical proximity correction, and phase shift adjustments. In some embodiments, the pattern may be a subset of a larger pattern corresponding to a layer, with the larger pattern being segmented into the subset for purposes of double patterning. In some embodiments, the pattern is a pattern corresponding to a reticle that has been obtained from a mask shop, and the process 50 may be performed to qualify the reticle before the reticle is released into production. In some embodiments, the pattern may specify, for example with pixels, the locations on a reticle where radiation is obstructed and the locations on a reticle where radiation is allowed to pass, as well as phase shift, in some embodiments. In some cases, the pattern is obtained as electronic data, for example, a data file used by a mask shop to write the pattern to a reticle.

Next, some embodiments may simulate the patterning process with a plurality of different simulations, each under different process characteristics, as indicated by block 54. Simulating may include simulating according to the techniques described above with reference to FIG. 2. Examples of simulating software are available from Brion Technologies Inc. of 4211 Burton Drive, Santa Clara, Calif. 95054, USA, and include software for process-window optimization. In some embodiments, the simulation may reflect attributes of a patterning system used in a patterning process to be qualified, for example, a wavelength of radiation, type of patterning system, type of resist, optical properties of immersion fluids, pre-and-post patterning recipes for resist application, hard back, and development, and the like.

In some embodiments, the simulations may simulate the patterning of the obtained pattern with such a patterning system under varying process characteristics, each simulation corresponding to a different set of process characteristics. Examples of process characteristics that may be varied include focus, exposure, and the like. In some embodiments, process characteristics may be varied according to a matrix, such as a two-dimensional matrix, a three-dimensional matrix, or a higher dimensional matrix, depending upon the number of process conditions being varied, to cover each permutation of variations in multiple dimensions of process characteristics through respective ranges.

The range over which process characteristics are varied may be selected based on experience with previous drift in such process characteristics with the patterning system or based on manufacturer guidance on tolerances of the process characteristics. In some embodiments, the ranges may be larger than previously observed drift to identify suitable settings for the process characteristics, for instance, to optimize or otherwise center a process. In some embodiments, a process engineer may specify a range of each process characteristic within which they would expect to find an optimal setting and increments to adjust the process characteristic through the range.

In some embodiments, each instance of simulation may apply a different permutation of the process characteristics to be varied, such as a particular focus and dose. In some embodiments, consecutive simulations may be performed, with one process characteristic varied by one increment between each consecutive simulation. Or in some embodiments, to expedite processing, multiple, or all of the simulations may be performed concurrently, each with different process characteristic settings.

In some embodiments, the result of the simulation may be a two-dimensional or three-dimensional model of a pattern expected to be formed on a substrate as a result of the simulated process, for example a three-dimensional model of resist as it would exist on the substrate after the resist is developed. Or some embodiments may model the chemical and mechanical properties of the resist, for example, as a three-dimensional model of which portions of the resist are expected to remain after the resist is developed. In some embodiments, the model may be expressed as a mesh or the model may be discretized, for example, as pixel or voxels, which each unit having attributes indicating properties of the resist.

Next, for each of the simulation results, some embodiments may detect features that the respective simulation indicates are unacceptable in a respective simulation result, as indicated by block 56. In some embodiments, a received pattern may be associated with tolerances specified by design engineers or electronic design automation software for various structures in the pattern. Examples include acceptable variations in line width, surface roughness, corner radius, sidewall shape (e.g., curvature or slope), overlay deviations, and the like. In some embodiments, these rules may be compared against the simulation result to distinguish structures that satisfy the rules from structures that do not satisfy the rules. In some embodiments, failing structures may be detected as features that the respective simulation indicates are unacceptable under these rules. In some embodiments, the amount of deviation from the specified tolerance may be associated with the detected structure for purposes of ranking structures according to the amount of deviation.

The portions of the pattern to be compared against such rules may be selected with a variety of techniques. For example, some embodiments may discretize the pattern and compare structures in the simulation result to the design tolerances at, for example, regular intervals along a line. In another example, some embodiments may apply such rules to each instance of a particular shape, such as each instance of a terminating line, each instance of a corner, or each instance of a via. As a result, in some embodiments, the step may yield a set of features deemed likely to fail under the given set of process characteristics corresponding to the simulation, and in some cases a measure of the degree of failure of each such feature. Further, some embodiments may generate this data structure for each simulation.

Thus, some simulations, for example, those close to where a process is likely properly centered, may have a relatively small set of features expected to fail based on the simulations. And other simulations, for example, those with a given process characteristic set relatively far from where that process characteristic is properly centered may have a relatively large number of detected features expected to fail. In some embodiments, different types of features are sensitive to different process characteristics in different ways, so in some cases, it is expected that certain features will fail, for example, as focus is varied while other features are expected to fail when exposure is buried.

Identifying such features is a non-trivial task. Often the features are a relatively small part of the pattern. Such features may be on the scale of 100 nanometers in a pattern spanning several hundred square millimeters. As such, the sensitive features suffer from the "needle in a haystack" problem. Traditionally, this has been addressed by comparing a pattern produced with a centered process to a pattern produced with a varied process, and directing attention to just those portions of the images that are different. But for the reasons discussed above, this process can be relatively slow when process centering must be performed before process window characterization. (Though, as discussed above, embodiments are also consistent with the traditional form of process centering before characterization.)

In some embodiments, failed features may be characterized in a variety of different fashions, for example, as candidate inspection locations. In some cases, the above-described inspection recipes may be automatically selected or created based on the particular tolerance expected to fail, for example, a distance between two edges may correspond to a deviation in acceptable line width or spacing between features. These inspection recipes may be associated with each inspection location and imported with the location to the metrology tool in some embodiments.

Next, some embodiments may select a subset of the features based on the detected features, as indicated by block 58. As noted above, each simulation may yield a set of detected features, with some simulations yielding relatively large numbers of such detected features that are expected to fail and other simulations, for example, those closer to a center point of a properly centered process including fewer. Some embodiments may select the subset of features from among the collection of simulation results based on sensitivity of those features to various process characteristics.

Sensitivity may be characterized in a variety of different ways. Some embodiments may calculate a partial derivative of a dimension of such a feature with respect to a given process characteristic according to the simulations and then select features in which the partial derivative exceed some threshold on either side of a zero partial derivative. Or some embodiments may select a feature in which the feature deviates more than a threshold amount from some tolerance within a relatively small amount of change in the process characteristic. In some embodiments, features may be selected based on interaction between the various varying process characteristics. For example, based on a mixed derivative, or based on a weighted combination of an amount of change of a dimension with changes in the various process characteristics. Some embodiments may calculate a percentage of a tolerance consumed by each feature at each process variation and then select features based on which features consume their full tolerance at the smallest deviation in process characteristic (or weighted combination thereof). In some embodiments, each feature in the simulations deemed to have been detected may be assigned a sensitivity score based on one or more of these values, and the features may be ranked according to the sensitivity score. In some embodiments, features above a threshold rank or above a threshold score may be selected. Thus, based on the simulated results, some embodiments may identify features expected to fail under a relatively small variation in a given process characteristic or combination of process characteristics relative to other features deemed to have failed under larger variations.

Next, some embodiments may determine inspection locations based on the selected subset of features, as indicated by block 60. In some embodiments, the inspection locations may be how the features are identified, in which case the selected list or set may also specify the inspection locations. In other cases, features deemed to fail may be used to determine inspection locations with subsequent processing. For example, failed features may be classified (e.g., as an isolated line, a dense line, a corner, a via, etc.) and mapped to various types of inspections or inspection locations.

In some embodiments, the process 50 may be performed with one or more instances of the below-described computer system. In some embodiments, such a computer system may be part of a patterning system, or such a computer system may be operated separately, for instance, in a remote data center. In some embodiments, code for performing the presently described steps may be encoded in one or more of the examples of non-transitory machine-readable media described below, such that when the program instructions are executed by a data processing apparatus, the operations described herein are effectuated.

Figure 4:
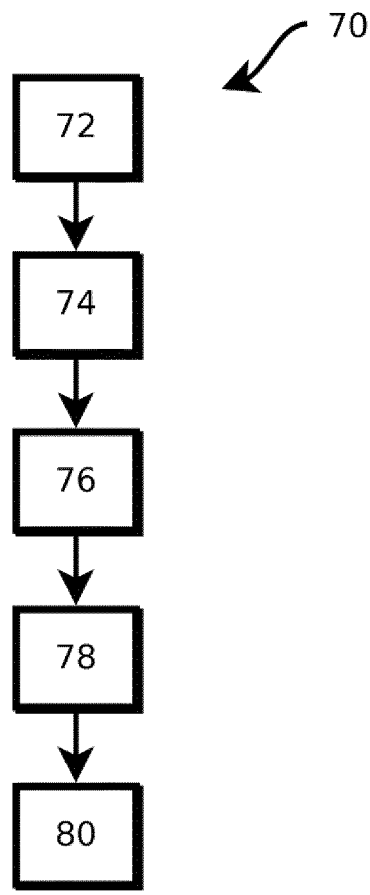
FIG. 4 is a flowchart of a process for characterizing a patterning process.

In some embodiments, the selected inspection locations may be used in a process window characterization process 70 illustrated in FIG. 4. Some embodiments may include obtaining a set of inspection locations for a patterning process, as indicated by block 72. In some embodiments, this obtained set may be obtained by performing the process of FIG. 3, or the inspection locations may be obtained with other techniques, for example empirically, like based on electrical data for a given device indicating structures known to be sensitive or based on structures expected to be sensitive to process characteristics even in the absence of simulation, like those structures having less than a threshold spatial dimension.

Next, some embodiments may pattern one or more substrates under varying process characteristics, as indicated by block 74. In some embodiments, this patterning process may use the pattern described above with reference to FIG. 3 in the context of a (non-simulated) patterning process that transfers a pattern to a substrate, in contrast to the simulated patterning process described above. In some embodiments, the varying process characteristics may be varied according to, for example, a focus exposure matrix or other techniques for varying process. In some embodiments, the features and attributes of a patterning system used in this step may be accounted for in the above-described simulations.

In some embodiments, this patterning step may be performed without first centering the patterning process or re-centering the patterning process in a given process characterization exercise. For example, some embodiments may pattern the one or more substrates without first undergoing one or more rounds of patterning substrates under varying process characteristics to determine a centerpoint for the process by empirically optimizing the process. As a result, some embodiments may advance to the process-window characterization stage relatively quickly compared to some traditional techniques.

This is not to say that some previous equipment calibration or process characterization work is not performed. For example, new product patterning systems are often characterized and tuned when initially installed in a semiconductor manufacturing facility. This step is distinct from the centering of a process for a given pattern. Similarly, a new pattern may be qualified in a manufacturing process, but sometime later a change in the pattern equipment or process may warrant a new characterization of a process window, for example, the introduction of a new consumable material, the performance of scheduled maintenance on the equipment, or the like, and the initial centering of the process may be distinct from centering that might otherwise occur as the equipment is brought back online. Thus, even if these earlier process characterization and centering steps have been performed, substantial time may still be saved by avoiding a process centering step that would have typically been performed again during a given process window characterization. (That said, as noted above, some embodiments may also recharacterize the center of the process window and use the present techniques to other ends.)

Next, some embodiments may determine, for each of the variations in the process characteristics whether at least some of the subset of features yielded unacceptable pattern structures on the one or more substrates at corresponding inspection locations, as indicated by block 76. In some embodiments, a metrology tool may automatically aligned to a pattern on the substrates and then translate to each of the inspection locations to perform a specified measurement of the resulting patterned structure. In some embodiments, these measured locations may be compared to a specified tolerance for the resulting structure, such as acceptable line widths, overlays, sidewall angles, and the like. As discussed above, in some embodiments, the inspection locations may be associated with image processing routines and corresponding acceptable tolerances. In some cases, each of the inspection locations may be associated with a value indicating whether the respective location is associated with a failed structure. In some embodiments, each failed structure may be associated with a measure indicating the degree to which the structure is in or out of tolerance.

Ranking of inspection locations may be used to expedite inspection. In some embodiments, inspection locations may be ranked according to sensitivity of the measurement location as indicated by a set of simulations, and this ranking may be used to shorten the inspection process. For example, some embodiments may inspect locations in order of decreasing sensitivity and terminate the inspection process once more than a threshold amount of inspected locations have passed, as once more sensitive locations are passing a process, then less sensitive locations may also be expected to pass. The shortening process may be performed on a process-characteristic-setting by process-characteristic-setting basis, as varied process characteristics may give rise to differing amounts of failures.

In some embodiments, the step may include identifying each of the features that yielded unacceptable pattern structures on one or more substrates. In some embodiments, this step may include identifying an amount or frequency of failure. As a result, in some embodiments, each set of varied process characteristics applied, for example, in one or more exposure fields on a substrate, may be associated with some characterization of an amount of features that yielded unacceptable pattern structures.

The present techniques may facilitate the use of particular types of metrology tools that, in some cases, do not require a reference pattern to detect defects. For example, some embodiments may inspect the measurement locations with automated electron-beam microscopes that aligned to a substrate, aligned to an exposure field, and then navigate to each of the measurement locations within a given exposure field to image each of the detected structures and compare those images to tolerances for the structures. In some cases, scanning an entire pattern with an electron-beam microscope during metrology would be a relatively slow and expensive process, so knowing in advance which locations are likely to have defects can, in some cases, greatly expedite use of these tools to characterize processes. Some embodiments may select features such that an automated electron-beam inspection tool can inspect the features in less than 24 hours, for instance in less than 12 hours, or in less than one hour, depending on tradeoffs between speed and comprehensiveness, though other embodiments may select feature sets that take longer to inspect in cases where speed is less of an issue. Similar advantages are expected for other types of metrology with a relatively small "field-of-view," including profilometers, focused-ion-beam inspection, and atomic force microscopes. That said, some embodiments are also consistent with other types of metrology, for example, thresholds for brightfield inspection may be adjusted for different locations based on expected sensitivity of structures.

Next, some embodiments may determine ranges of the process characteristics that produce acceptable results as indicated by block 78. In some embodiments, the step may include determining a centerpoint for a patterning process. In some embodiments, an amount of failures in the resulting structures is associated with each permutation of the process characteristics. Some embodiments may select as a centerpoint a permutation producing the lowest amount of failures. Other embodiments may use more advanced statistical techniques to select a centerpoint (e.g., an optimal focus and exposure setting). For example, a surface, such as a two-dimensional or higher surface may be fit to the resulting data, such as a surface having a number of dimensions corresponding to the amount of process characteristics that are varied. In some embodiments, a minimum for the surface may be selected as the centerpoint, and a process window may be defined according to a boundary around that minimum where the surface crosses a threshold amount of failures. Thus, some embodiments may specify a centerpoint for focus, a maximum focus and a minimum focus, along with a centerpoint for exposure, a maximum exposure and a minimum exposure. Some embodiments may also specify maximum and minimum values for interactions of process characteristics, such as maximums for a weighted combination of focus and exposure or minimums for a weighted combination of focus and exposure.

Next, some embodiments may monitor a patterning process by sensing whether the patterning process remains within the ranges of the process characteristics, as indicated by block 80. The step may further include performing the patterning process with a set point corresponding to centerpoints identified with the techniques described above. For example, some embodiments may determine whether focus of a patterning process exceeds a maximum for focus and in response to detecting such a condition, rework substrates, adjust an equipment setting, or perform maintenance.

By identifying structures likely to fail in advance as process characteristics are varied, via simulation under varied process characteristics, some embodiments may provide various benefits. These include expedited process window characterization, as process centering is consolidated with window characterization. Advantages may also include higher-resolution process characterization data, as substrate space previously used for reference patterns may be used for test conditions. Advantages may also include expediting or improving the accuracy of various types of metrology. It should be noted, though, that not all embodiments provide all of, or any of, these benefits, as the various engineering and cost tradeoffs may warrant pursuit of subsets of these advantages or different advantages.

Figure 5:
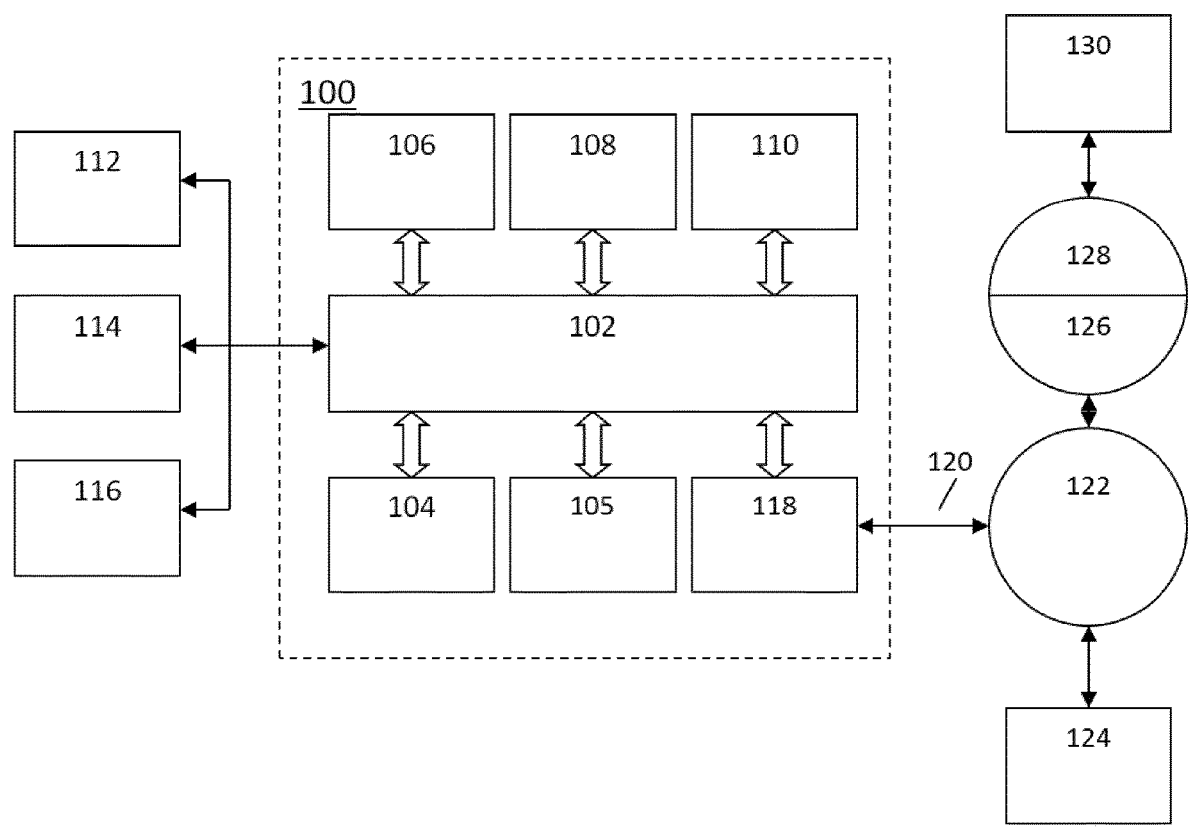
FIG. 5 is a block diagram of an example computer system.

FIG. 5 is a block diagram that illustrates a computer system 100 that may assist in implementing the simulation, characterization, and qualification methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106.

Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. The computer need not be co-located with the patterning system to which an optimization process pertains. In some embodiments, the computer (or computers) may be geographically remote.

The term "computer-readable medium" as used herein refers to any tangible, non-transitory medium that participates in providing instructions to processor 104 for execution. Such a medium may take many forms, including non-volatile media and volatile media. Non-volatile media include, for example, optical or magnetic disks or solid state drives, such as storage device 110. Volatile media include dynamic memory, such as main memory 106. Transmission media include coaxial cables, copper wire and fiber optics, including the wires or traces that constitute part of the bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. In some embodiments, transitory media may encode the instructions, such as in a carrier wave.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 6:
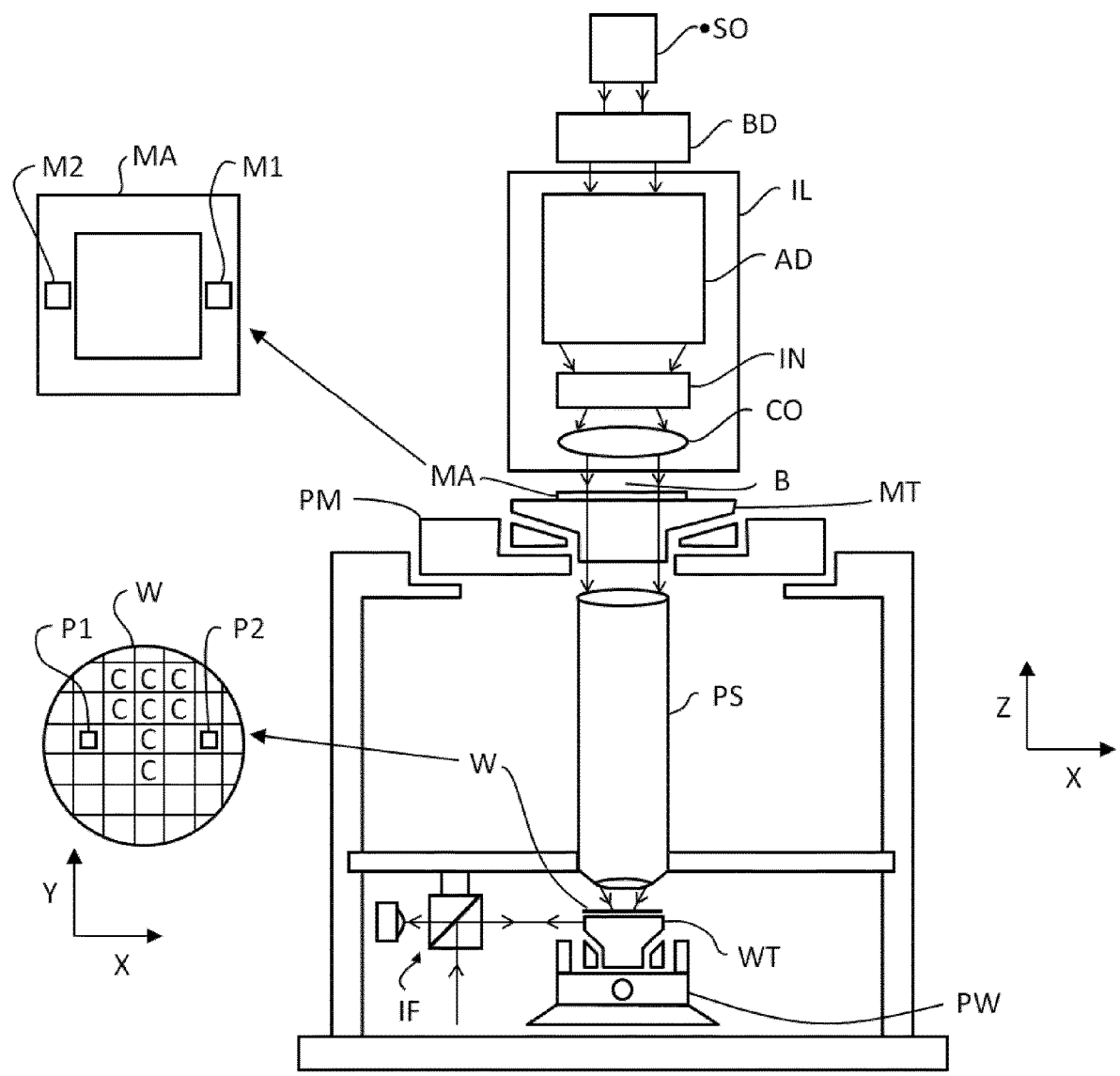
FIG. 6 is a schematic diagram of another lithography system.

FIG. 6 schematically depicts an exemplary lithographic projection apparatus whose process window for a given process may be characterized with the techniques described herein. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as -outer and -inner, respectively) of the intensity distribution in the beam. In addition, it will generally comprise various other components, such as an integrator IN and a condenser CO. In this way, the beam B impinging on the patterning device MA has a desired uniformity and intensity distribution in its cross section.

It should be noted with regard to FIG. 6 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 6. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 7:
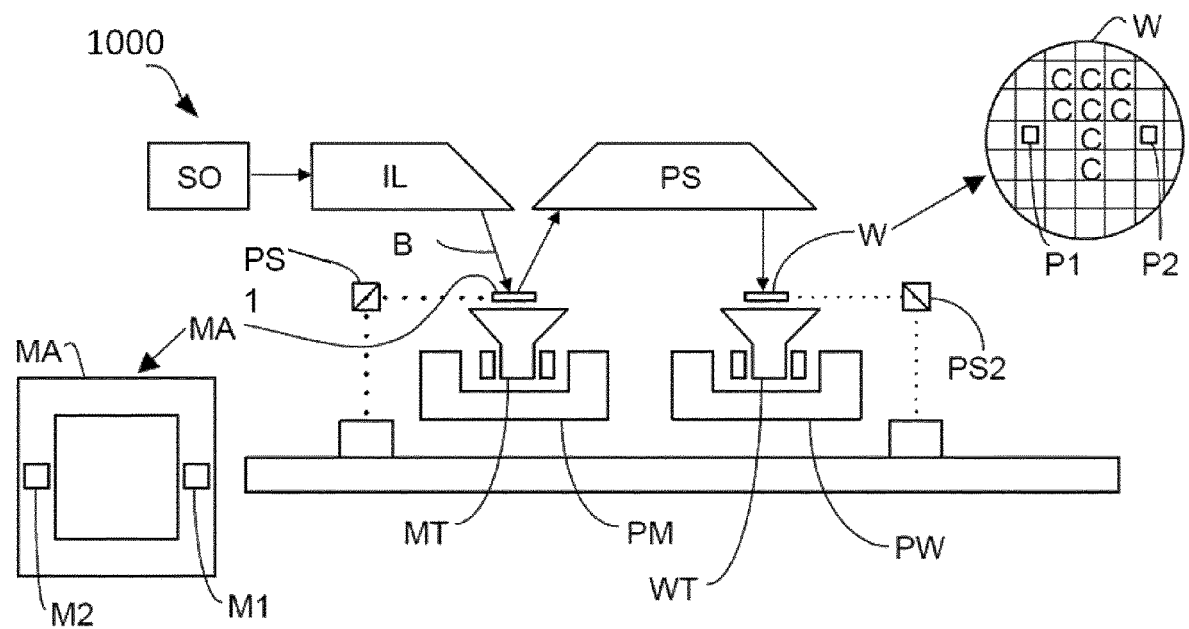
FIG. 7 is a schematic diagram of another lithography system.

FIG. 7 schematically depicts another exemplary lithographic projection apparatus 1000 whose process window for a given process may be characterized with the techniques described herein.

The lithographic projection apparatus 1000, in some embodiments, includes:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

As shown in FIG. 7, in some embodiments, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 7, for providing the laser beam exciting the fuel. The resulting plasma emits output radiation, e.g., EUV radiation, which is collected using a radiation collector, disposed in the source collector module. The laser and the source collector module may be separate entities, for example, when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may include an adjuster for adjusting the angular intensity distribution of the radiation beam. Generally, at least the outer or inner radial extent (commonly referred to as σ-outer and σ-inner, respectively) of the intensity distribution in a pupil plane of the illuminator can be adjusted, in some embodiments. In addition, the illuminator IL may include various other components, such as faceted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device, in this example. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometer, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 may be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.
3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that uses programmable patterning device, such as a programmable mirror array of a type as referred to above.

Figure 8:
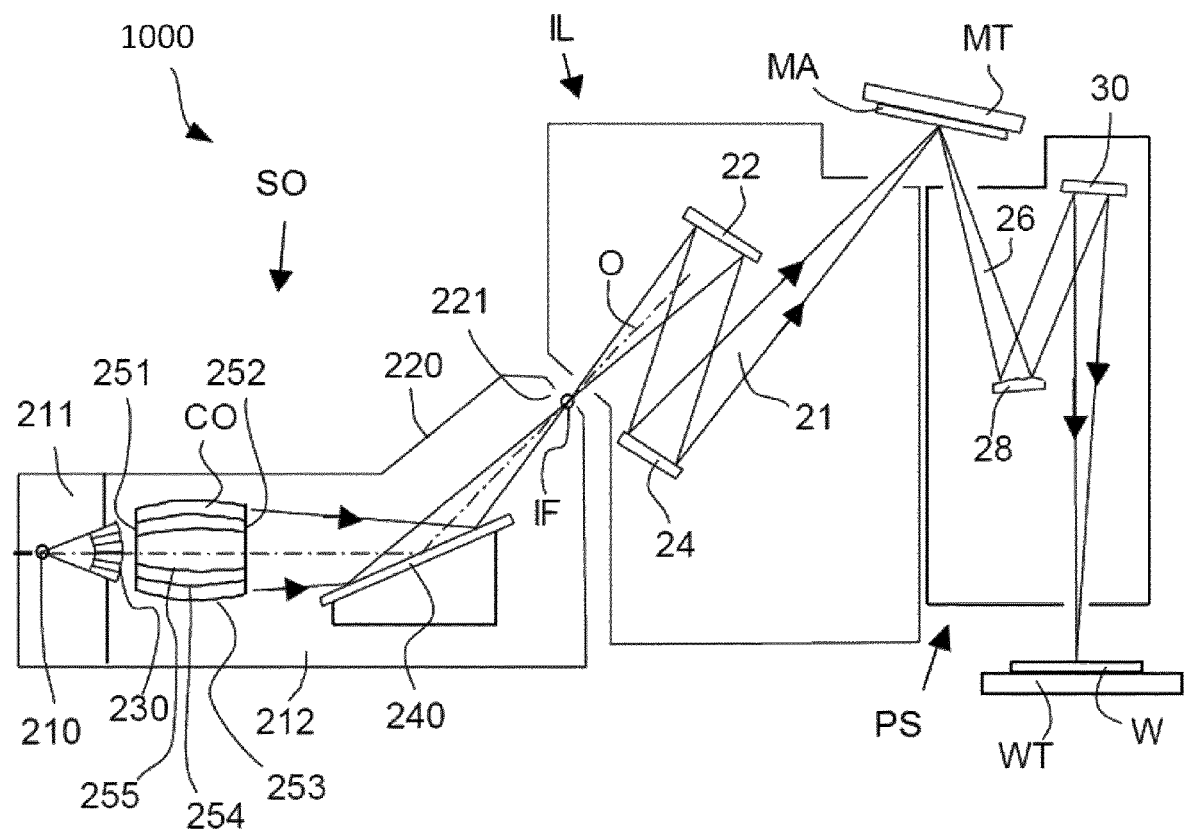
FIG. 8 is a more detailed view of the system in FIG. 7.

FIG. 8 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 8.

Collector optic CO, as illustrated in FIG. 8, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 9:
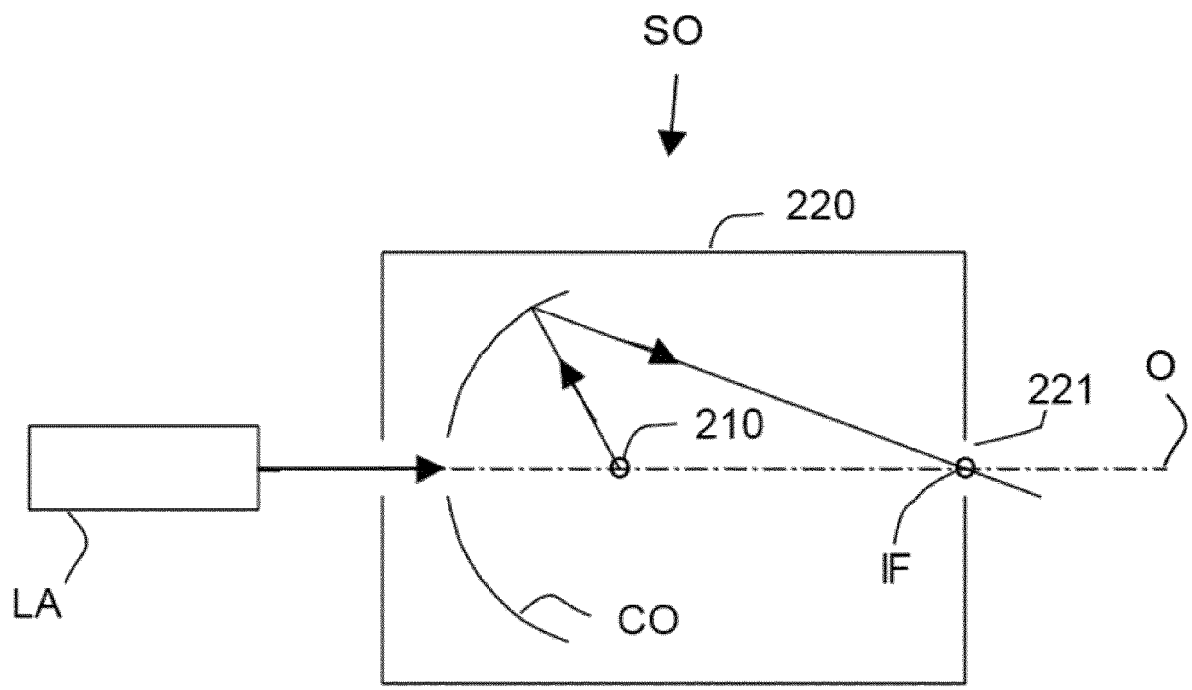
FIG. 9 is a more detailed view of the source collector module SO of the system of FIGS. 7 and 8.

Alternatively, the source collector module SO may be part of an LPP radiation system as shown in FIG. 9. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

In this patent, certain U.S. patents, U.S. patent applications, or other materials (e.g., articles) have been incorporated by reference. The text of such U.S. patents, U.S. patent applications, and other materials is, however, only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference in this patent.

The present techniques will be better understood with reference to the following enumerated embodiments:

1. A method of characterizing a process window of a patterning process, the method comprising: obtaining a set of inspection locations for a pattern defining features to be applied to a substrate with a patterning process, the set of inspection locations corresponding to a subset of the features, the subset of features being selected from among the features according to sensitivity of the respective features to variation in one or more process characteristics of the patterning process; patterning one or more substrates under varying process characteristics of the patterning process; and determining, for each of the variations in the process characteristics, whether at least some of the subset of features yielded unacceptable patterned structures on the one or more substrates at corresponding inspection locations.

2. The method of embodiment 1, wherein obtaining the set of inspection locations comprises simulating, with one or more computers, the patterning process with a plurality of different simulations, each under different process characteristics; for each of the different simulations, detecting features that the respective simulation indicates are unacceptable in a respective simulation result; and selecting the subset of the features based on the detected features.

3. The method of embodiment 2, wherein selecting the subset of the features based on the detected features comprises: selecting features based on sensitivity of the respective features to changes in a process characteristic of the patterning process in the simulated result.

4. The method of any of embodiments 2 to 3, wherein selecting the subset of the features based on the detected features comprises: selecting at least some of the detected features based on an amount of change in a process characteristic in the simulations that yields an unacceptable simulated result for the respective feature.

5. The method of any of embodiments 2 to 4, wherein simulating comprises: obtaining a design layout of a reticle corresponding to the pattern; obtaining parameters of a lithographic apparatus; selecting a set of the process characteristics of the patterning process to simulate; and estimating, with one or more computers, dimensions of a patterned structure on a substrate under the selected set of process characteristics with a lithographic apparatus having the obtained parameters.

6. The method of any of embodiments 1 to 5, comprising: determining a process window for at least some of the varied process characteristics based on the determination of whether at least some of the subset of the features yielded unacceptable patterned structures on the one or more substrates.

7. The method of embodiment 6, wherein the process window is determined without first determining process characteristics to produce a reference pattern on a substrate to be compared with a pattern formed under varied process conditions in the determining step.

8. The method of any of embodiments 1 to 7, wherein determining whether at least some of the subset of features yielded unacceptable pattern structures comprises: measuring the at least some of the subset of features at the respective locations with an electron-beam inspection tool.

9. The method of embodiment 8, comprising: importing at least some of the inspection locations and corresponding tolerances for respective features indicative of whether the feature is acceptable to the electron-beam inspection tool; and automatically inspecting respective features on the substrate by driving the electron-beam inspection tool to the respective locations and comparing sensed dimensions of respective features to the corresponding tolerances.

10. The method of any of embodiments 1 to 9, wherein different inspection locations are specified for different exposure fields based on process conditions corresponding to the respective exposure fields.

11. The method of any of embodiments 1 to 10, comprising: ranking the features based on sensitivity to variations in one or more process characteristics; and selecting the subset of features based on the ranking.

12. The method of any of embodiments 1 to 11, comprising: specifying an inspection metric based on sensitivity of at least some of the features to variation in a process characteristic.

13. The method of any of embodiments 1 to 12, comprising: determining ranges of the process characteristics that produce acceptable results; and monitoring a patterning process by sensing whether the patterning process remains within ranges of the process characteristics.

14. The method of embodiment 13, comprising: producing electrical, optical, or mechanical devices using the monitored patterning process to pattern one or more layers of the produced devices.

15. The method of any of embodiments 1 to 14, wherein obtaining the inspection locations comprises performing steps for simulating the patterning process.

16. The method of any of embodiments 1 to 15, wherein: the pattern is defined by a reticle; more than 1000 inspection locations are obtained; the subset of features is a subset of the pattern selected such that the subset of features take less than twenty-four hours to inspect with an automated electron-beam inspection tool; the inspection locations are associated with data defining acceptable tolerances of features at the measurement locations; the inspection locations are expressed according to a location in an exposure field or a die in a form suitable for directing the automated electron-beam inspection tool to the inspection locations; sensitivity of a feature is determined based on a size of a range of a process characteristic in which an acceptable result is obtained in a simulated patterning process a size of the range for other features; at least some of the features correspond to functioning portions of patterned devices; the patterning process comprises a photolithographic patterning process and at least some of the features are smaller than a wavelength of light used in the photolithographic patterning process; the process characteristics include focus and exposure; more than 40 different sets of process characteristics tested on a single substrate; or the method comprises determining at least part of a process window of the patterning process without centering patterning process before patterning one or more substrates under varying process characteristics.

17. A method of obtaining inspections locations to qualify a patterning process, the method comprising: simulating, with one or more computers, a patterning process with a plurality of different simulations, each under different process characteristics of the patterning process, and each simulating applying features in a pattern; for each of the different simulations, detecting features that the respective simulation indicates are unacceptable in a respective simulation result; and selecting a subset of the features based on the detected features.

18. The method of embodiment 17, wherein selecting the subset of the features based on the detected features comprises: selecting features based on sensitivity of the respective features to changes in a process characteristic in the simulated result.

19. The method of any of embodiments 17 to 18, wherein selecting the subset of the features based on the detected features comprises: selecting at least some of the detected features based on an amount of change in a process characteristic in the simulations that yields an unacceptable simulated result for the respective feature.

20. The method of any of embodiments 17 to 19, comprising: patterning one or more substrates under varying process characteristics; determining, for each of the variations in the process characteristics, whether at least some of the subset of features yielded unacceptable patterned structures on the one or more substrates at corresponding inspection locations by inspecting the patterned structures with an electron-beam inspection tool; and determining at least part of a process window for the patterning process based on whether at least some of the subset of features yielded unacceptable patterned structures on the one or more substrates, wherein the at least part of the process window is determined without centering patterning process before patterning one or more substrates under varying process characteristics.

21. A method comprising: obtaining an inspection location for a pattern, the pattern defining features to be applied to a substrate with a patterning process, the inspection location corresponding to a feature of the pattern, the feature being selected from among the features according to sensitivity of the respective feature to variation in one or more process characteristics of the patterning process; patterning one or more substrates under varying process characteristics of the patterning process; and determining, for at least some of the variations in the process characteristics, whether the feature yielded an unacceptable patterned structure on the one or more substrates at the corresponding inspection location.

22. The method of embodiment 21, wherein obtaining the inspection location comprises: simulating, with one or more computers, the patterning process with a plurality of different simulations, each under different process characteristics; for each of the different simulations, detecting features that the respective simulation indicates are unacceptable in a respective simulation result; and selecting the feature based on the detected features.

23. The method of embodiment 22, wherein simulating comprises: obtaining a design layout of a reticle corresponding to the pattern; obtaining parameters of a lithographic apparatus; selecting a set of the process characteristics of the patterning process to simulate; and estimating, with one or more computers, dimensions of a patterned structure on a substrate under the selected set of process characteristics with a lithographic apparatus having the obtained parameters.

24. The method of any of embodiments 21 to 23, comprising: determining a process window for at least some of the varied process characteristics based on the determination of whether the feature yielded an unacceptable patterned structure on the one or more substrates.

25. A tangible, non-transitory, machine readable media storing instructions that when executed by a data processing apparatus effectuate operations comprising: the operations of any of embodiments 1 to 13, 17 to 19, and 21 to 24.

22. A system comprising: one or more processors; and memory storing instructions that when executed effectuate operations comprising: the operations of any of embodiments 1 to 13, 17 to 19, and 21 to 24.

The invention claimed is:

1. A method for characterizing a process window of a patterning process, the method comprising:
    obtaining a set of inspection locations for a pattern, the pattern defining features to be applied to a substrate with a patterning process, the set of inspection locations corresponding to a subset of the features, the subset of features being selected from among the features according to sensitivity of the respective one or more features of the subset of features to variation in one or more process characteristics of the patterning process;
    optically or physically patterning one or more substrates under variations of one or more process characteristics of the patterning process; and
    determining, for each of the variations in the one or more process characteristics, whether at least some of the subset of features yielded one or more unacceptable patterned structures on the one or more substrates at corresponding one or more inspection locations.

2. The method of claim 1, wherein obtaining the set of inspection locations further comprises:
    performing a plurality of computer simulations of the patterning process, each simulation under different values of one or more process characteristics;
    for each of the different simulations, detecting features that the respective simulation indicates are unacceptable in a respective simulation result; and
    selecting the subset of the features based on the detected features.

3. The method of claim 2, wherein selecting the subset of the features based on the detected features further comprises:
    selecting one or more features based on sensitivity of the respective one or more features to change in a process characteristic of the patterning process in the simulated result, or
    selecting at least some of the detected features based on an amount of change in a process characteristic in the simulations that yields an unacceptable simulated result for the respective feature.

4. The method of claim 2, wherein performing a computer simulation of the computer simulations further comprises:
    obtaining a design layout of a patterning device corresponding to the pattern;
    obtaining parameters of a lithographic apparatus;
    selecting a set of process characteristics of the patterning process to simulate; and
    estimating dimensions of a patterned structure on a substrate under the selected set of process characteristics with a lithographic apparatus having the obtained parameters.

5. The method of claim 1, further comprising determining a process window for at least some of the variations in the one or more process characteristics based on the determination of whether at least some of the subset of the features yielded one or more unacceptable patterned structures on the one or more substrates.

6. The method of claim 1, wherein determining whether at least some of the subset of features yielded one or more unacceptable pattern structures further comprises measuring the at least some of the subset of features at the respective inspection locations with an electron-beam inspection tool.

7. The method of claim 1, wherein different inspection locations are specified for different exposure fields based on process conditions corresponding to the respective exposure fields.

8. The method of claim 1, further comprising:
    ranking the features based on sensitivity to variations in one or more process characteristics of the patterning process; and
    selecting the subset of features based on the ranking.

9. The method of claim 1, further comprising specifying an inspection metric based on sensitivity of at least some of the features to variation in a process characteristic.

10. The method of claim 1, further comprising:
determining ranges of the one or more process characteristics that produce acceptable results; and
monitoring a patterning process by sensing whether the patterning process remains within the ranges of the one or more process characteristics.

11. A method comprising:
obtaining an inspection location for a pattern, the pattern defining features to be applied to a substrate with a patterning process, the inspection location corresponding to a feature of the pattern, the feature being selected from among the features according to sensitivity of the respective feature to variation in one or more process characteristics of the patterning process;
optically or physically patterning one or more substrates under variations of one or more process characteristics of the patterning process; and
determining, for at least some of the variations in the one or more process characteristics, whether the feature yielded an unacceptable patterned structure on the one or more substrates at the corresponding inspection location.

12. The method of claim 11, wherein obtaining the inspection location further comprises:
performing a plurality of computer simulations of the patterning process, each simulation under different values of one or more process characteristics;
for each of the different simulations, detecting features that the respective simulation indicates are unacceptable in a respective simulation result; and
selecting the feature based on the detected features.

13. The method of claim 12, wherein performing a computer simulation of the computer simulations further comprises:
obtaining a design layout of a patterning device corresponding to the pattern;
obtaining parameters of a lithographic apparatus;
selecting a set of process characteristics of the patterning process to simulate; and
estimating dimensions of a patterned structure on a substrate under the selected set of process characteristics with a lithographic apparatus having the obtained parameters.

14. The method of claim 11, further comprising determining a process window for at least some of the variations in the one or more process characteristics based on the determination of whether the feature yielded an unacceptable patterned structure on the one or more substrates.

15. A tangible, non-transitory, machine-readable medium storing instructions, the instructions, upon execution by a data processing apparatus, are configured to cause the data processing apparatus to at least:
obtain a set of inspection locations for a pattern, the pattern defining features to be applied to a substrate with a patterning process, the set of inspection locations corresponding to a subset of the features, the subset of features being selected from among the features according to sensitivity of the respective one or more features of the subset of features to variation in one or more process characteristics of the patterning process;
simulate a patterning process with a plurality of different simulations, each under different values of one or more process characteristics, and each with at least some of the same features in a pattern; and
determine, for each of the different values of one or more process characteristics, whether at least some of the subset of features yielded one or more unacceptable patterned structures on the one or more substrates at corresponding one or more inspection locations.

16. The medium of claim 15, wherein the instructions configured to obtain the set of inspection locations are further configured to:
perform a plurality of computer simulations of the patterning process, each simulation under different values of one or more process characteristics and/or using different sets of one or more process characteristics;
for each of the different simulations, detect features that the respective simulation indicates are unacceptable in a respective simulation result; and
select the subset of the features based on the detected features.

17. The medium of claim 16, wherein the instructions configured to select the subset of the features based on the detected features are further configured to:
select one or more features based on sensitivity of the respective one or more features to changes in a process characteristic of the patterning process in the simulated result, or
select at least some of the detected features based on an amount of change in a process characteristic in the simulations that yields an unacceptable simulated result for the respective feature.

18. The medium of claim 15, wherein the instructions are further configured to determine a process window for at least some of the different values of one or more process characteristics based on the determination of whether at least some of the subset of the features yielded one or more unacceptable patterned structures on the one or more substrates.

19. The medium of claim 15, wherein different inspection locations are specified for different exposure fields based on process conditions corresponding to the respective exposure fields.

20. The medium of claim 15, wherein the instructions are further configured to specify an inspection metric based on sensitivity of at least some of the features to variation in a process characteristic.

21. A tangible, non-transitory, machine-readable medium storing instructions, the instructions, upon execution by a data processing apparatus, are configured to cause the data processing apparatus to at least:
obtain an inspection location for a pattern, the pattern defining features to be applied to a substrate with a patterning process, the inspection location corresponding to a feature of the pattern, the feature being selected from among the features according to sensitivity of the respective feature to variation in one or more process characteristics of the patterning process;
obtain measurement results from one or more substrates optically or physically patterned under variations of one or more process characteristics of the patterning process; and
determine, for at least some of the variations in the one or more process characteristics and based on the measurement results, whether the feature yielded an unacceptable patterned structure on the one or more substrates at the corresponding inspection location.

* * * * *